(12) United States Patent
Ball

(10) Patent No.: US 11,714,464 B2
(45) Date of Patent: Aug. 1, 2023

(54) ADJUSTABLE TRAY ASSEMBLY FOR DATA STORAGE DEVICES

(71) Applicant: Seagate Technology LLC, Cupertino, CA (US)

(72) Inventor: Stuart R. Ball, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 406 days.

(21) Appl. No.: 16/522,489

(22) Filed: Jul. 25, 2019

(65) Prior Publication Data

US 2021/0026421 A1 Jan. 28, 2021

(51) Int. Cl.
*G06F 1/18* (2006.01)
*H01R 43/26* (2006.01)
*H05K 7/14* (2006.01)

(52) U.S. Cl.
CPC ............ *G06F 1/187* (2013.01); *H01R 43/26* (2013.01); *H05K 7/1454* (2013.01); *H01R 2201/06* (2013.01)

(58) Field of Classification Search
CPC ..... G06F 1/187; H01R 43/26; H01R 2201/06; H05K 7/1454
See application file for complete search history.

(56) References Cited

U.S. PATENT DOCUMENTS

| | | | | |
|---|---|---|---|---|
| 3,463,343 A * | 8/1969 | Asenbauer | ........... | B65D 21/086 220/8 |
| 4,478,331 A * | 10/1984 | Ruin | .................... | B65D 25/107 206/454 |
| 5,016,772 A * | 5/1991 | Wilk | ..................... | B65D 21/086 220/495.01 |
| 6,076,142 A * | 6/2000 | Corrington | ............. | G06F 1/184 710/306 |
| 6,124,707 A | 9/2000 | Kim et al. | | |
| 6,351,378 B1 * | 2/2002 | Chao | ........................ | G06F 1/184 312/332.1 |
| 6,722,895 B1 * | 4/2004 | Brodsky | ................. | G06F 1/184 439/67 |
| 6,806,700 B2 * | 10/2004 | Wanek | ................. | G11B 33/022 324/750.03 |
| 7,070,323 B2 * | 7/2006 | Wanek | ............... | G01R 31/2849 324/750.08 |
| 7,203,060 B2 | 4/2007 | Kay et al. | | |
| 7,451,912 B1 * | 11/2008 | Taube, II | ........... | A47G 29/1209 232/29 |
| 7,778,017 B2 * | 8/2010 | Huang | ..................... | G06F 1/187 361/679.2 |

(Continued)

*Primary Examiner* — Jinhee J Lee
*Assistant Examiner* — Keith DePew
(74) *Attorney, Agent, or Firm* — Faegre Drinker Biddle & Reath LLP

(57) ABSTRACT

A tray assembly for positioning data storage devices is disclosed. The tray assembly includes a base, a backplane circuit board coupled to the base, an electrical connector coupled to the backplane circuit board, a first support bracket coupled to the base and moveable with respect to the base and the backplane circuit board, and a second support bracket coupled to the base. The second support bracket opposes the first support bracket and is moveable towards and away from the first support bracket to adjust a distance between the first support bracket and the second support bracket.

19 Claims, 5 Drawing Sheets

(56) References Cited

U.S. PATENT DOCUMENTS

| | | | |
|---|---|---|---|
| 8,154,862 B2* | 4/2012 | Lai | G11B 33/122 |
| | | | 361/679.33 |
| 8,189,346 B2* | 5/2012 | Lee | G06F 1/187 |
| | | | 361/801 |
| 8,254,106 B2* | 8/2012 | Lin | G11B 33/124 |
| | | | 361/679.33 |
| 9,519,318 B2* | 12/2016 | Davis | G06F 1/187 |
| 9,564,178 B2 | 2/2017 | Kay | |
| 9,639,124 B2* | 5/2017 | Wang | G11B 33/022 |
| 9,652,001 B2* | 5/2017 | Wang | G06F 1/187 |
| 9,746,886 B2 | 8/2017 | Davis et al. | |
| 9,746,887 B2* | 8/2017 | Lai | G11B 33/124 |
| 9,820,404 B1* | 11/2017 | Wu | G06F 1/16 |
| 10,067,543 B2* | 9/2018 | Charpiot | G06F 1/187 |
| 10,074,403 B2* | 9/2018 | Chen | G06F 1/187 |
| 10,455,715 B2* | 10/2019 | Choyikkunnil | G11B 33/124 |
| 10,546,616 B2* | 1/2020 | Ku | G06F 1/187 |
| 2004/0023522 A1* | 2/2004 | Chang | H01R 29/00 |
| | | | 439/43 |
| 2005/0116702 A1 | 6/2005 | Wanek et al. | |
| 2011/0005068 A1* | 1/2011 | Zhang | G11B 33/124 |
| | | | 29/729 |
| 2012/0147545 A1* | 6/2012 | Niu | G11B 33/122 |
| | | | 361/679.31 |
| 2015/0022069 A1* | 1/2015 | Lv | G06F 1/187 |
| | | | 312/309 |
| 2017/0018293 A1* | 1/2017 | Chen | G11B 33/124 |
| 2017/0052572 A1* | 2/2017 | Wang | G06F 1/187 |
| 2017/0292873 A1* | 10/2017 | Schleicher | G11B 33/02 |
| 2018/0136701 A1* | 5/2018 | Charpiot | G06F 1/187 |
| 2019/0166714 A1 | 5/2019 | Choyikkunnil et al. | |
| 2019/0174642 A1 | 6/2019 | Choyikkunnil et al. | |
| 2019/0237110 A1* | 8/2019 | Ku | G11B 33/124 |

\* cited by examiner

ADJUSTABLE TRAY ASSEMBLY FOR DATA STORAGE DEVICES

SUMMARY

In certain embodiments, a tray assembly for positioning data storage devices is disclosed. The tray assembly includes a base, a backplane circuit board coupled to the base, an electrical connector coupled to the backplane circuit board, a first support bracket coupled to the base and moveable with respect to the base and the backplane circuit board, and a second support bracket coupled to the base. The second support bracket opposes the first support bracket and is moveable towards and away from the first support bracket to adjust a distance between the first support bracket and the second support bracket.

In certain embodiments, a system includes multiple tray assemblies. Each tray assembly includes a base, a backplane circuit board coupled to the base, an electrical connector coupled to the backplane circuit, a first support bracket coupled to the base and moveable with respect to the base and the backplane circuit board, and a second support bracket coupled to the base. The second support bracket opposes the first support bracket and is moveable towards and away from the first support bracket to adjust a distance between the first support bracket and the second support bracket.

In certain embodiments, a method for use with a tray assembly is disclosed. The tray assembly includes a base, a backplane circuit board coupled to the base and including an electrical connector, a first support bracket moveably coupled to the base, and a second support bracket moveably coupled to the base. The method includes laterally adjusting the first support bracket and the second support bracket towards or away from each other with respect to the base such that a data storage electrical connector of a data storage device positioned in a carrier will be aligned with the electrical connector of the tray assembly. The method further includes sliding the carrier within the tray assembly to mechanically couple the data storage electrical connector to the electrical connector of the tray assembly.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
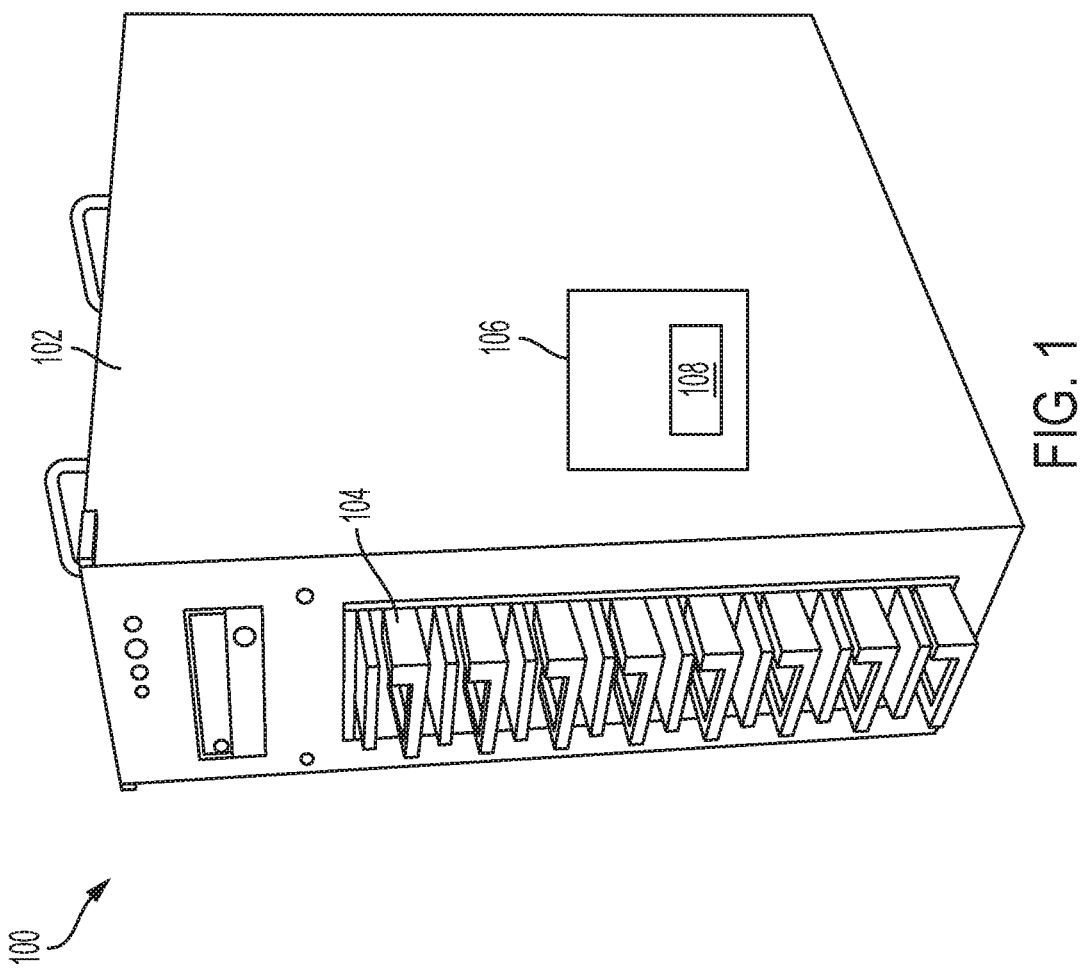
FIG. 1 shows a system for operating and testing data storage devices, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage devices such as hard disk drives positioned with data storage system (e.g., servers) are typically mounted in individual carriers. The carriers may include various features that help reduce vibration and make it easier to install and uninstall data storage devices to and from the data storage system. The carriers are typically designed to interface with a specific data storage system chassis. Although data storage devices such as hard disk drives have standard form factors (e.g., 2.5 inch form factor and 3.5 inch form factor), carriers have different designs because different manufacturers have different chassis designs.

When data storage devices need to be tested in the field (e.g., because of an error), the data storage devices are typically removed from the data storage system and coupled to a testing system. Current testing systems are designed to accommodate standard data storage device form factors so that the testing systems can be used universally with the industry's standardized sizes of data storage devices. As such, to test data storage devices, data storage devices must first be removed from their carrier before being placed in or otherwise coupled to the testing system. During the act of removing the data storage devices and coupling the data storage devices to the test system, the data storage devices may be damaged. Further, having to remove the data storage devices from their carriers adds manual labor and time to the process of testing the data storage devices.

Certain embodiments of the present disclosure are directed to systems, assemblies, and methods for accommodating different sized carriers so that data storage devices do not need to be removed from their carriers.

FIG. 1 shows a system 100 including a chassis 102 and multiple tray assemblies 104. Although the system 100 shows the chassis 102 as housing eight different tray assemblies 104, the system 100 can include fewer or more tray assemblies 104. The system 100 can include or be coupled to a computing device 106 (e.g., personal computer, laptop, and the like) with memory 108. The memory 108 can store various testing routines (described in more detail below) carried out by the computing device 106 to test data storage devices positioned within the the tray assembly 104.

Figure 2:
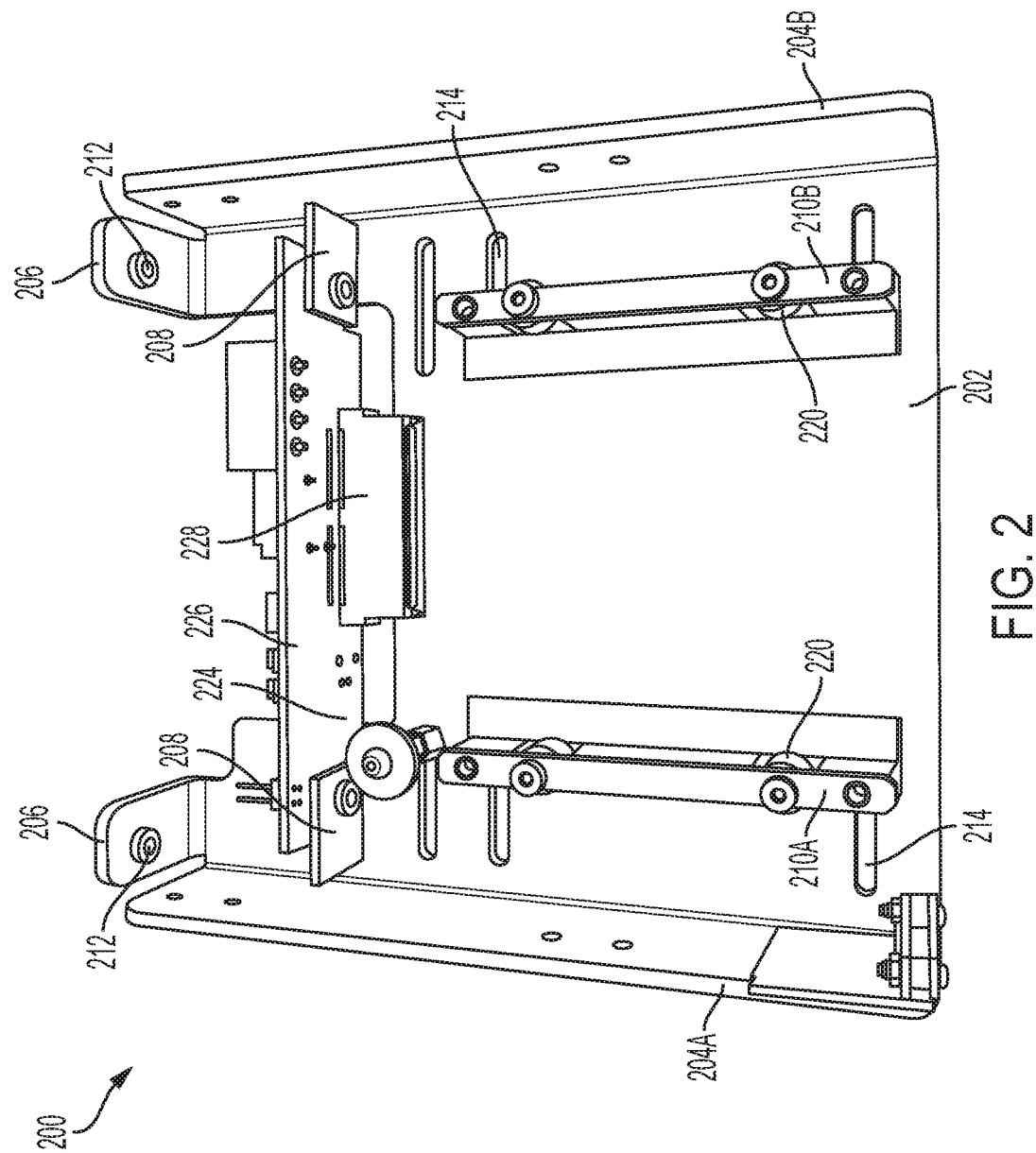
FIG. 2 shows a schematic of a tray assembly for use in the system of FIG. 1, in accordance with certain embodiments of the present disclosure.
Figure 3:
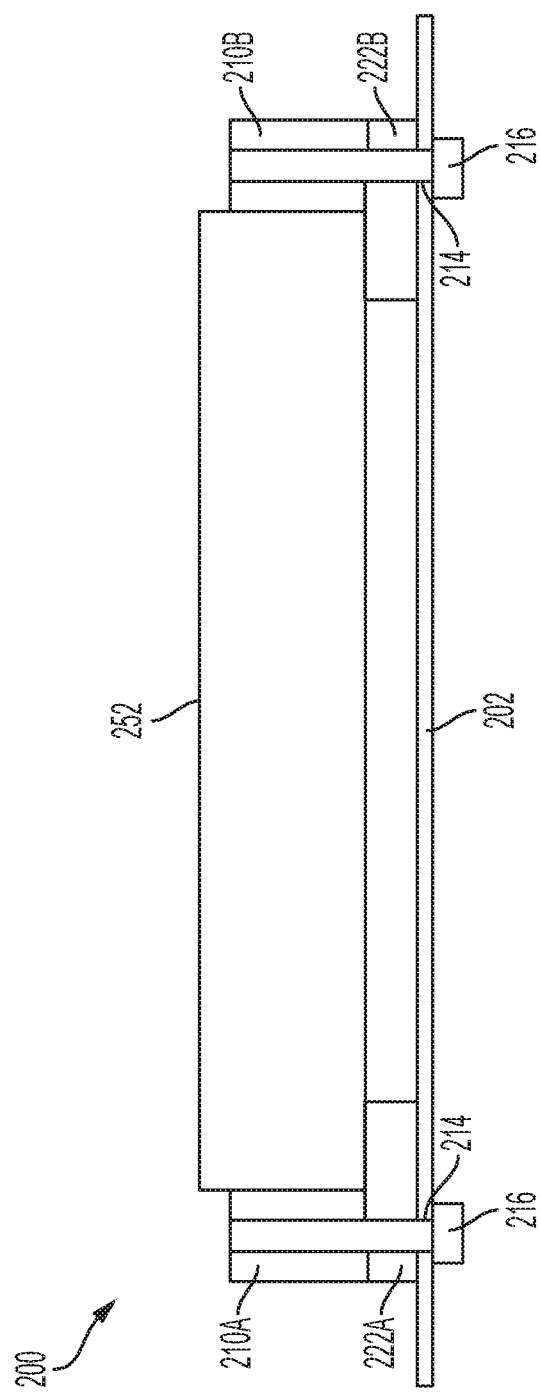
FIG. 3 shows a side, cut-away view of the tray assembly of FIG. 2 with a carrier positioned on the tray assembly, in accordance with certain embodiments of the present disclosure.
Figure 4:
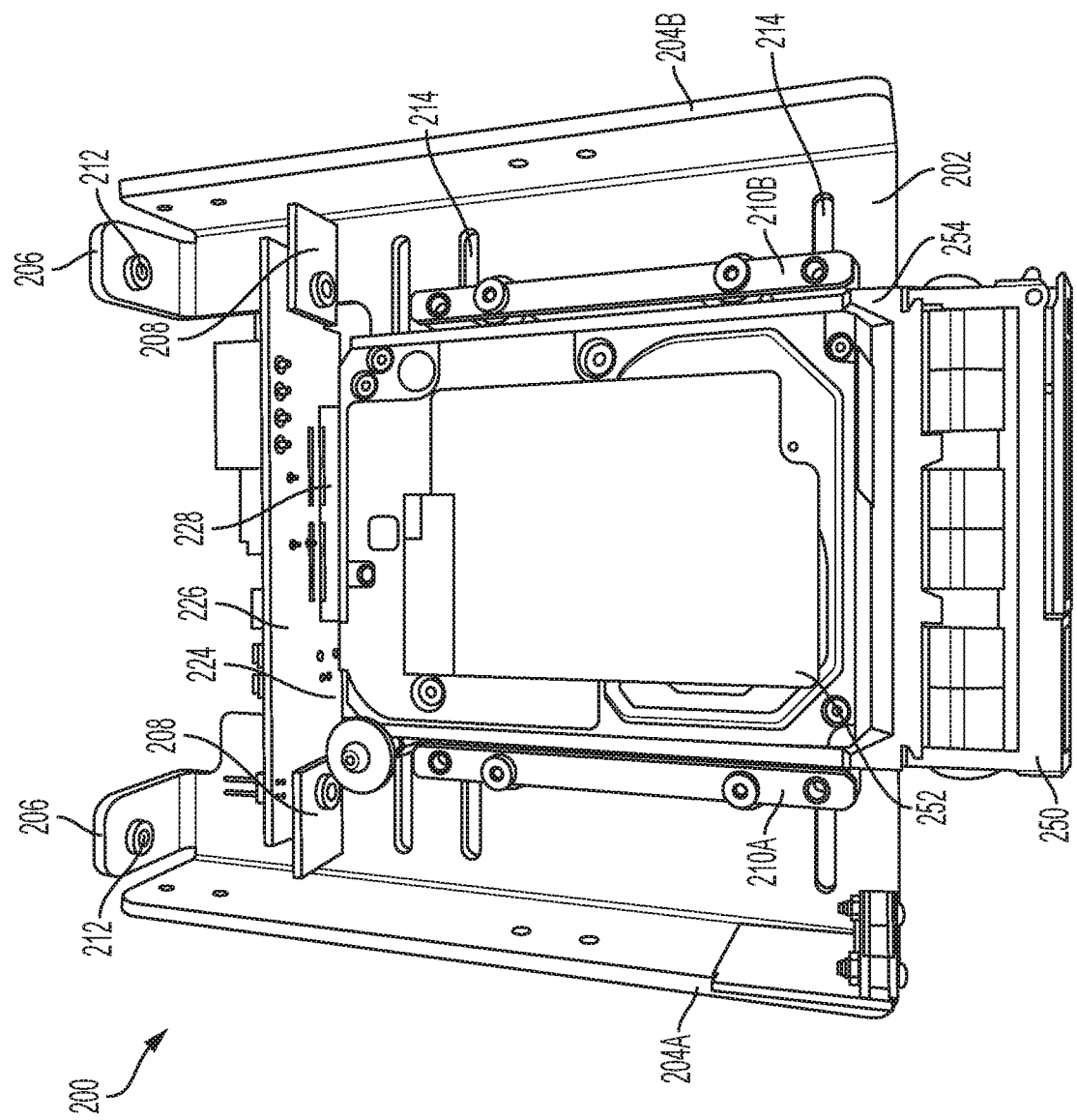
FIG. 4 shows the tray assembly of FIGS. 2 and 3 with a carrier, in accordance with certain embodiments of the present disclosure.

FIGS. 2 and 3 show various aspects of a tray assembly 200 that can be, at least partially, positioned within a chassis (e.g., the chassis 102 of the system 100). FIG. 4 shows the tray assembly 200, a carrier 250, and data storage device 252 (e.g., hard disk drive and solid state drive) coupled to the tray assembly 200.

The tray assembly 200 includes a base 202 (e.g., base plate), a first outer side wall 204A, and a second outer side wall 204B. The tray assembly 200 also includes one or more back support walls 206, one or more backplane circuit support walls 208, a first support bracket 210A, and a second support bracket 210B. The back support walls 206 can accommodate fasteners 212 that secure the tray assembly 200 within a system (e.g., to couple to a chassis or another part of the system). In certain embodiments, the base 202, the first outer side wall 204A, the second outer side wall 204B, and the one or more back support walls 206 together form a frame of the tray assembly 200. In certain embodiments, these members of the frame are integrally formed (e.g., formed from one sheet of metal and bent to create the various walls), while in other embodiments, various members of the frame are separate components coupled together (e.g., welded, fastened). In certain embodiments, the frame does not include the various side walls. In certain embodiments, the frame of the tray assembly 200 comprises a metal material such as aluminum or steel.

The first support bracket 210A and the second support bracket 210B are moveable or adjustable with respect to each other and the base 202 so that the tray assembly 200 can accommodate different sized carriers for data storage devices. FIG. 2 shows slot-shaped apertures 214 in the base 202 that can guide the path of travel of the respective first support bracket 210A and the second support bracket 210B. A shown in FIGS. 2 and 4, the apertures 214 guide the the first support bracket 210A and the second support bracket 210B towards or away from each other. Fasteners 216 (e.g., bolts, screws) shown in FIG. 3 can extend through the apertures 214 as well as the respective first support bracket 210A and the second support bracket 210B so that the position of the first support bracket 210A and the second support bracket 210B can be adjusted and then locked into place. For example, the first support bracket 210A and the second support bracket 210B can accommodate the fasteners 216 such that the fasteners 216 extend through holes in the first support bracket 210A and the second support bracket 210B. The fasteners 216 further extend through respective apertures 214 in the base 202. Nuts or similar mechanisms can be used to tighten against the base 202 and/or the first support bracket 210A and the second support bracket 210B such that the first support bracket 210A and the second support bracket 210B are locked into position with respect to the base 202. When in an unlocked state, the first support bracket 210A and the second support bracket 210B can be moved such that a distance between the two can be adjusted to accommodate different sized carriers of data storage devices.

In certain embodiments, the first support bracket 210A and the second support bracket 210B each include one or more rollers 220. When the carrier 250 (shown in FIGS. 3 and 4) is inserted between the first support bracket 210A and the second support bracket 210B, the rollers 220 help the carrier 250 to slide into the tray assembly 200. For example, sidewalls 254 (FIG. 4) of the carrier 250 can be directly coupled to rolling surfaces of the rollers 220 and slid into the tray assembly 200. The rollers 220 are shown in FIG. 2 as being able to rotate around a rotational axis that is perpendicular to a plane of the base 202. Additionally or alternatively, the tray assembly 200 can include rollers that couple to bottom and/or top surfaces of the carrier 250 to further assist with positioning the carrier in the tray assembly 200. In certain embodiments, the rollers 220 comprise a compliant material (e.g., an elastomer) to help dampen vibration to and from the carrier 250 and to provide a less rigid component for coupling to the carrier 250.

As shown in FIGS. 2 and 3, the first support bracket 210A and the second support bracket 210B are coupled to or integral with respective shims 222A and 222B. The first shim 222A is positioned between the first support bracket 210A and the base 202, and the second shim 222B is positioned between the second support bracket 210B and the base 202. The shims 222A and 222B can be used to accommodate different-sized carriers. For example, in addition to different carriers having different widths, carriers may also vary in height from manufacturer to manufacturer. Different shims can be used to accommodate the different heights of carriers.

As shown in FIGS. 2 and 4, the tray assembly 200 can also include one or more top guides 224 that limit the carrier's vertical movement in the tray assembly 200. For example, the top guide 224 can include a plate or washer that extends parallel to the base 202 so that the carrier 250 is guided between the top guide 224 and the base 202 as the carrier 250 is inserted into the tray assembly 200. The top guide 224 can reduce the risk that the carrier 250 is inserted at an undesirable angle into the tray assembly 200. The top guide 224 is shown in FIGS. 2 and 4 as being positioned towards the back of the tray assembly 200 near one of the backplane circuit support walls 208. In certain embodiments, the top guide 224 is adjustable and lockable such that a distance between the top guide 224 and the base 202 can be modified.

FIGS. 2 and 4 show the tray assembly 200 including a backplane circuit board 226, which is shown as being coupled to the backplane circuit support walls 208. When the carrier 250 (and therefore data storage device 252) is properly installed in the tray assembly 200 as shown in FIG. 4, the backplane circuit board 226 is mechanically and electrically coupled to the data storage device 252. For example, the backplane circuit board 226 includes an electrical connector 228, which is coupled to an electrical connector 256 of the data storage device 252 when the carrier 250 is installed in the tray assembly 200. In certain embodiments, the electrical connector 228 is coupled to the electrical connector 256 without intervening cables such that the connectors are directly coupled to each other. The electrical connector 228 of the backplane circuit board 226 can utilize a communication protocol (and therefore electrical pin layout) such as SAS, SATA, and NVMe corresponding to the communication protocol used by the data storage devices 252 to be inserted into the tray assembly 200. The backplane circuit board 226 is electrically and communicatively coupled to a computing device of a system (e.g., the computing device 106 of the system 100 of FIG. 1). For example, the backplane circuit board 226 can include another electrical connector that is coupled to cables that couple to the computing device. As described below in more detail, the computing device carries out testing routines for testing the data storage device 252. In certain embodiments, the electrical connector 228 of the backplane circuit board 226 is positioned centrally within the tray assembly 200. In certain embodiments, the position of the backplane circuit board 226 can be adjusted.

Figure 5:
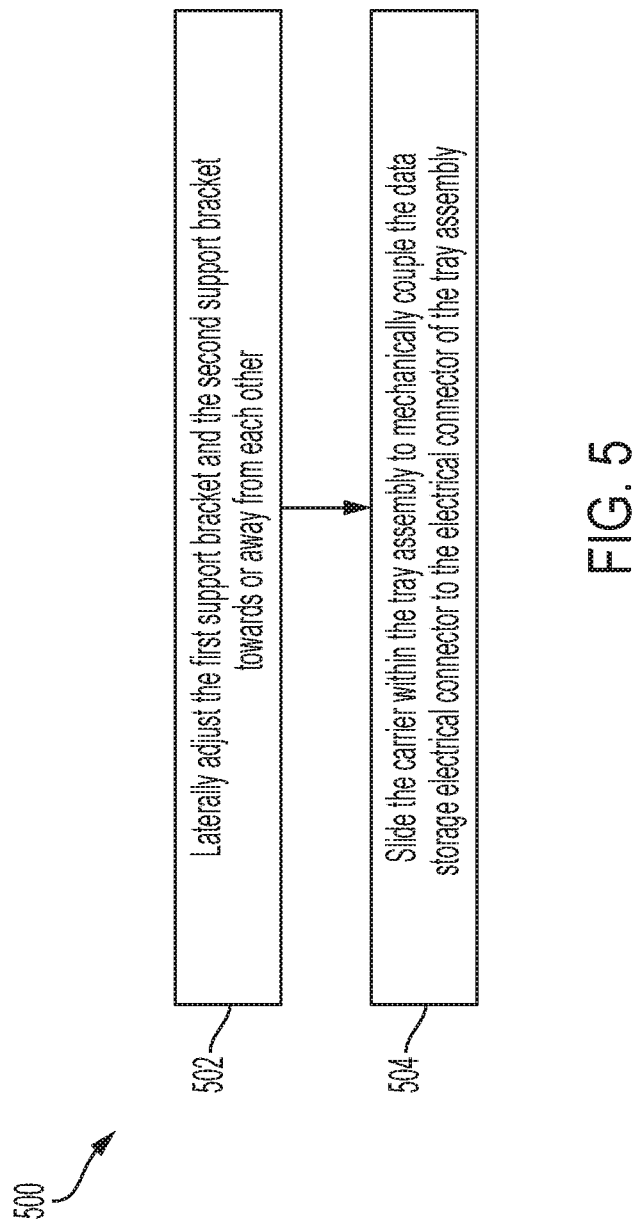
FIG. 5 shows a block diagram representing steps of a method, in accordance with certain embodiments of the present disclosure.

FIG. 5 outlines various steps of a method 500 that can be used to install the carrier 250 into the tray assembly 200. The method 500 includes laterally adjusting the first support bracket 210A and the second support bracket 210B towards or away from each other with respect to the base 202 such that the electrical connector 256 of the data storage device 252 positioned in the carrier 250 will be aligned with the electrical connector 228 of the backplane circuit board 226 in the tray assembly 200 (block 502 in FIG. 5).

The method 500 also includes sliding the carrier 250 (and therefore the data storage device 252) within the tray assembly 200 to mechanically couple the electrical connector 256 of the data storage device 252 to the electrical connector 228 of the backplane circuit board 226 in the tray assembly 200 (block 504 in FIG. 5). For example, the carrier 250 can be coupled to the rollers 220 of the first support bracket 210A and the second support bracket 210B as the carrier 250 is slid into the tray assembly 200. The rollers 220, the first support bracket 210A, and the second support bracket 210B help guide the carrier 250 into the tray assembly 200 towards the electrical connector 228 of the backplane circuit board 226. As the carrier 250 continues to be inserted into the tray assembly 200, the aligned electrical connectors mate with each other such that they are mechanically and electrically coupled to each other. In certain embodiments, instead of the rollers 220, the carrier 250 slides against the opposing surface of the first support bracket 210A and the second support bracket 210B as the carrier 250 is inserted into the tray assembly 200. In certain embodiments, the carrier 250 also slides against the top guide 224 so that the carrier 250 is aligned vertically as the carrier 250 is inserted into the tray assembly 200. In certain embodiments, the carrier 250 also slides against the base 202 of one or more of the shims 222A and 222B as the carrier 250 is inserted into the tray assembly 200. In certain embodiments, before sliding the carrier 250 into the tray assembly 200, the first support bracket 210A and the second support bracket 210B are locked into position. For example, after the first support bracket 210A and the second support bracket 210B have been adjusted to a desired position, the fasteners 216 can be used to secure the position of the brackets with respect to the base 202. Further, the top guide 224 can be locked into position before the carrier 250 is inserted into the tray assembly 200. In certain embodiments, the positions of the first support bracket 210A, the second support bracket 210B, and/or the top guide 224 and the use of shims 222A and 222B is determined and locked before the tray assembly 200 is inserted and secured to the chassis (e.g., the chassis 102 of the system 100 of FIG. 1). For example, the first support bracket 210A the second support bracket 210B can be adjusted and locked into place while the tray assembly 200 is positioned outside the chassis.

By adjusting—and providing the capability to adjust—the first support bracket 210A and the second support bracket 210B before fully inserting the carrier 250, the tray assembly 200 can accommodate different-sized carriers while reducing the risk of damaging data storage devices positioned within the carriers. Further, the same tray assembly design can be utilized at manufacturers with varying sizes of data storage systems (and therefore carriers) without requiring data storage devices to be removed from their carriers for insertion into the tray assemblies. For example, various carriers designed to accommodate 3.5 inch form factor hard disk drives but with different respective carrier wall thicknesses can be used with the same tray assembly design without removing the hard disk drives from the different-sized carriers.

Although the embodiments shown in the figures feature support brackets that are both adjustable, in other embodiments, one of the support brackets can have a fixed position and the other support bracket can be adjustable. Such a tray assembly design may be useful if the carriers to be tested each have the same wall thickness such that the data storage devices' electrical connectors are in the same position with respect to one side of the carrier.

As mentioned above, once the carrier 250 is positioned in the tray assembly 200 and the electrical connector 256 of the data storage device 252 is electrically and mechanically coupled to the electrical connector 228 of the backplane circuit board 226, the data storage device 252 can be subjected to one or more testing routines. In certain embodiments, the testing routines are designed to test performance of the data storage devices 252 under various conditions. For example, the data storage devices 252 can be powered up and controlled to carry out particular data read, data write, track seek, motor spin up, and/or motor spin down operations. As the data storage devices 252 are subjected to testing routines, errors (e.g., SMART errors) can be tracked and recorded. For example, an error log file can be created and later analyzed for identifying the source of errors. The error log file can be automatically communicated to a remote location or a central database for analysis or for tracking incoming returns of data storage devices. As another example, the tray assembly 200 and/or the system 100 can include various LEDs that are activated to indicate errors or status via green, yellow, and red colors. A green light can indicate that the data storage device 252 has passed the testing routine, a yellow light can indicate that the data storage device 252 is still undergoing the testing routine, and a red light can indicate that the data storage device 252 has failed the testing routine. In certain embodiments, the testing routines include checking for prior errors to determine whether the data storage device was mishandled such as being overheated or subjected to a shock event. In certain embodiments, the testing routines include erasing data from the data storage device 252 in the event the data storage device 252 is to be returned. Erasing data helps with data privacy protection.

The testing routines may be automatically initiated once the carrier 250 is positioned in the tray assembly 200 and the electrical connector 256 of the data storage device 252 is electrically and mechanically coupled to the electrical connector 228 of the backplane circuit board 226. For example, the tray assembly 200 or the system 100 may automatically detect when the electrical connection has been made and then can power up the data storage device 252 and run one or more testing routines.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

I claim:

1. A tray assembly for positioning data storage devices, the tray assembly comprising:
   a base;
   a backplane circuit board coupled to the base;
   an electrical connector coupled to the backplane circuit board;
   a first support bracket coupled to the base and moveable with respect to the base and the backplane circuit board in a lateral direction; and
   a second support bracket coupled to the base, opposing the first support bracket, and moveable towards and away from the first support bracket in the lateral direction to adjust a distance between the first support bracket and the second support bracket.

2. The tray assembly of claim 1, wherein the first support bracket and the second support bracket each include a roller that rotates around an axis perpendicular to a plane of the base.

3. The tray assembly of claim 2, wherein the rollers comprise an elastomer.

4. The tray assembly of claim 1, wherein the first support bracket and the second support bracket can be locked into place.

5. The tray assembly of claim 4, wherein the base includes an aperture through which a component of the locking mechanism completely passes through from one side of the base to another side of the base.

6. The tray assembly of claim 5, wherein the locking mechanism comprises a bolt and a nut.

7. The tray assembly of claim 1, further comprising:
a first shim positioned between the first support bracket and the base; and
a second shim positioned between the second support bracket and the base.

8. The tray assembly of claim 7, wherein the first shim is coupled to the first support bracket, wherein the second shim is coupled to the second support bracket.

9. The tray assembly of claim 1, further comprising:
a first outer sidewall coupled to the base; and
a second outer sidewall coupled to the base, wherein the first support bracket and the second support bracket are positioned between the first outer sidewall and the second outer sidewall and adjustable with respect to the first outer sidewall and the second outer sidewall.

10. The tray assembly of claim 1, further comprising:
an adjustable top guide extending parallel to the base.

11. The tray assembly of claim 1, wherein the first support bracket is moveable towards and away from the second support bracket in the lateral direction to adjust a distance between the first support bracket and the second support bracket.

12. The tray assembly of claim 1, wherein the tray assembly is configured to hold only one data storage device at a time.

13. A system comprising:
multiple tray assemblies, each including:
a base,
a backplane circuit board coupled to the base,
an electrical connector coupled to the backplane circuit,
a first support bracket coupled to the base and moveable with respect to the base and the backplane circuit board in a lateral direction, and
a second support bracket coupled to the base, opposing the first support bracket, and moveable towards and away from the first support bracket in the lateral direction to adjust a distance between the first support bracket and the second support bracket.

14. The system of claim 13, further comprising:
a chassis, wherein the multiple tray assemblies are coupled to and at least partially positioned within the chassis.

15. The system of claim 13, wherein the first support bracket and the second support bracket each include a roller that rotates around an axis perpendicular to a plane of the base.

16. The system of claim 13, further comprising:
a computing device coupled to memory and communicatively coupled to the backplane circuit board, the memory includes testing routines for testing data storage devices.

17. The system of claim 13, wherein the first support bracket and the second support bracket can be adjusted to accommodate different-sized data storage devices carriers containing data storage devices of the same form factor.

18. The system of claim 13, wherein the first support bracket is moveable towards and away from the second support bracket in the lateral direction to adjust a distance between the first support bracket and the second support bracket.

19. The system of claim 13, wherein each of the tray assemblies is configured to hold only one data storage device at a time.

* * * * *